United States Patent [19]
Thomann

[11] Patent Number: 5,953,258
[45] Date of Patent: Sep. 14, 1999

[54] DATA TRANSFER IN A MEMORY DEVICE HAVING COMPLETE ROW REDUNDANCY

[75] Inventor: Mark R. Thomann, Boise, Id.

[73] Assignee: Micron Technology, Inc., Boise, Id.

[21] Appl. No.: 09/109,031

[22] Filed: Jul. 1, 1998

Related U.S. Application Data

[62] Division of application No. 08/695,166, Aug. 8, 1996, Pat. No. 5,815,447.

[51] Int. Cl.⁶ ........................................ G11C 7/00
[52] U.S. Cl. .................... 365/189.01; 365/149; 365/154; 365/200; 365/230.05
[58] Field of Search ..................... 365/200, 149, 365/154, 230.05, 189.01

[56] References Cited

U.S. PATENT DOCUMENTS

| | | | |
|---|---|---|---|
| 5,281,868 | 1/1994 | Morgan | 307/441 |
| 5,327,380 | 7/1994 | Kersh, III et al. | 365/195 |
| 5,361,231 | 11/1994 | Hayano | 365/200 |
| 5,508,638 | 4/1996 | Cowles et al. | 326/38 |
| 5,513,137 | 4/1996 | Lee et al. | 365/185.09 |
| 5,528,539 | 6/1996 | Ong et al. | 365/200 |
| 5,559,742 | 9/1996 | Lee et al. | 365/200 |
| 5,657,266 | 8/1997 | McLaury | 365/149 |
| 5,680,363 | 10/1997 | Dosaka et al. | 365/230.3 |

*Primary Examiner*—David Nelms
*Assistant Examiner*—Hoai V. Ho
*Attorney, Agent, or Firm*—Schwegman, Lundberg Woessner & Kluth P.A

[57] ABSTRACT

An ATM switch including a multi-port memory is described. The multi-port memory has a dynamic random access memory (DRAM) and input and output serial access memories (SAMs). The multi-port memory includes an array of primary and redundant memory cells. Data transfer buses are described which traverse the array and can be coupled to either the primary or redundant memory cells. Redundant row enable circuitry is described which enables an entire row of redundant memory cells to be substituted for any row of primary memory cells.

5 Claims, 9 Drawing Sheets

DATA TRANSFER IN A MEMORY DEVICE HAVING COMPLETE ROW REDUNDANCY

This application is a division of U.S. Ser. No. 08/695,166 filed Aug. 8, 1996, U.S. Pat. No. 5,815,447.

TECHNICAL FIELD OF THE INVENTION

The present invention relates generally to ATM switches and in particular the present invention relates to internally transferring data in a multi-port memory ATM switch.

BACKGROUND OF THE INVENTION

The general increase in network traffic requires fast, efficient methods of managing traffic and congestion. One problem area in network traffic management occurs at line switching where a switch is used to route data from one set of communication lines to another set of communication lines. Network switches typically comprise a memory-type device which is used to temporarily store a transmission during the switching operation.

Different queuing structures have been employed in network switches with varying results. It has been shown that switches which use input queue structures tend to create line blocking. Conversely, switches which use output queue architectures eliminate the line blocking problem. Further, switches used in asynchronous transfer mode (ATM) networks require more storage space than switches used in a more uniform transmission network. That is, ATM traffic tends to have bursts of data and be non-uniform, thereby requiring an increased amount of available memory at any given time to maintain an acceptable switching time for the ATM traffic. Poor switch time performance can result in the loss of ATM data during switching operations.

The increased demand for more memory and the need for faster switching times has resulted in the need for a fast, efficient ATM switch Further, the variety of different ATM data cell structures requires that the switch be flexible. One specific problem in ATM switching is the need to change the routing of an ATM cell to avoid highly congested traffic paths. This typically requires that a header included in the ATM cell be amended to denote a new route, or destination address. Additional information included in an ATM cell, such as error check data, may also need to be updated. Further, because memories are susceptible to the inducement of errors, an ATM switch should include an error check scheme to monitor the occurrence of any errors induced during switching.

For the reasons stated above, and for other reasons stated below which will become apparent to those skilled in the art upon reading and understanding the present specification, there is a need in the art for an ATM switch which includes flexible redundancy of a complete memory row.

SUMMARY OF THE INVENTION

The above mentioned problems with ATM switches and other problems are addressed by the present invention and which will be understood by reading and studying the following specification. An ATM switch is described which includes redundant memory rows that can be used to replace a row of memory cells located anywhere in a memory array. Data transfer buses which can be coupled to either the redundant rows or primary rows are provided.

In particular, one embodiment of the present invention describes a multi-port memory comprising an array of primary dynamic random access memory cell capacitors arranged in rows and columns. First access devices are coupled to the primary dynamic random access memory cell capacitors and first digit lines. The first access devices selectively couple the primary dynamic random access memory cell capacitors to the first digit lines. Redundant rows of redundant dynamic random access memory cell capacitors are provided, and second access devices are coupled to the redundant dynamic random access memory cell capacitors and second digit lines. The second access devices selectively couple the redundant dynamic random access memory cell capacitors to the second digit lines. A data transfer bus is provided which traverse the array and the redundant rows. The data transfer bus selectively coupled to the first and second digit lines.

In a second embodiment, a multi-port memory is described which comprises an array of primary memory cells arranged in addressable rows and columns, and a redundant row of memory cells. Data transfer buses which traverse the array and the redundant row of memory cells are provided. Address decode circuitry for coupling a row of primary memory cells to the data transfer bus in response to an address signal, and an enable circuit for coupling the redundant row of memory cells to the data transfer bus in response to the address signal are also provided.

DETAILED DESCRIPTION OF THE INVENTION

In the following detailed description of the preferred embodiment, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

The present invention is described as being incorporated in a multi-port memory. The simplified block diagram of the multi-port memory 100 shown in FIG. 1 can be used to solve data path requirements for asynchronous transfer mode (ATM) networks. The memory has a dynamic random access memory (DRAM) 102 and eight double-buffered input serial access memories (SAMs) 104(0)–(7). The eight output SAMs 106(0)–(7) are also double-buffered. The input SAM's can accept back-to-back ATM cells such that one full ATM cell can be moved into the DRAM from an input port while a second ATM cell is being loaded into the input port. Likewise, the output SAM's can output one ATM cell on a four bit data bus while a second ATM cell is being transferred from the DRAM.

Figure 1:
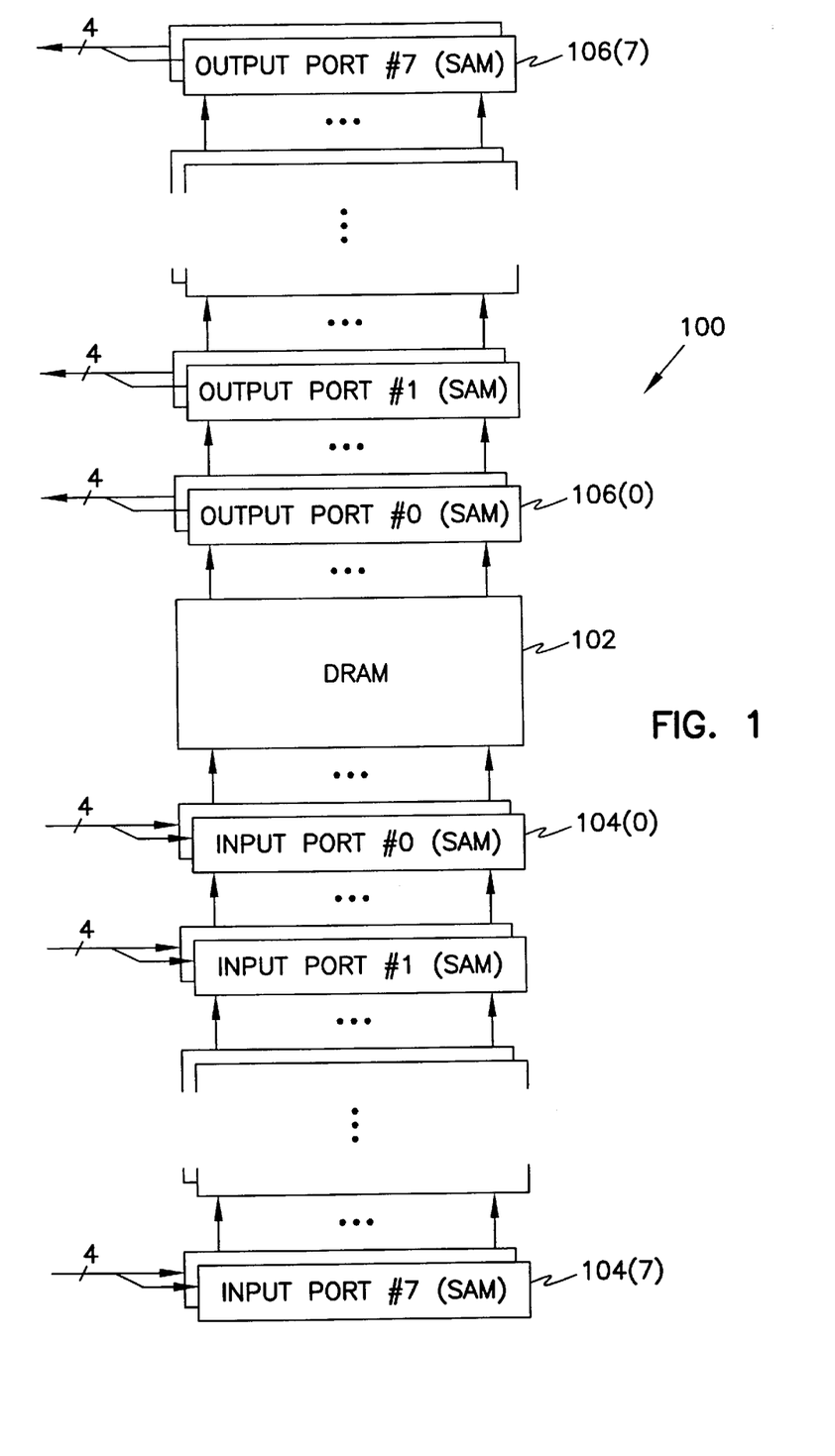
FIG. 1 is a simplified block diagram of a multi-port memory.

ATM cells flow through input ports into the input SAM's where editing can be performed. The ATM cells are transferred to the DRAM and then transferred to the output SAM's where further editing can be performed. The ATM cells are output on communication lines via output ports.

Figure 2:
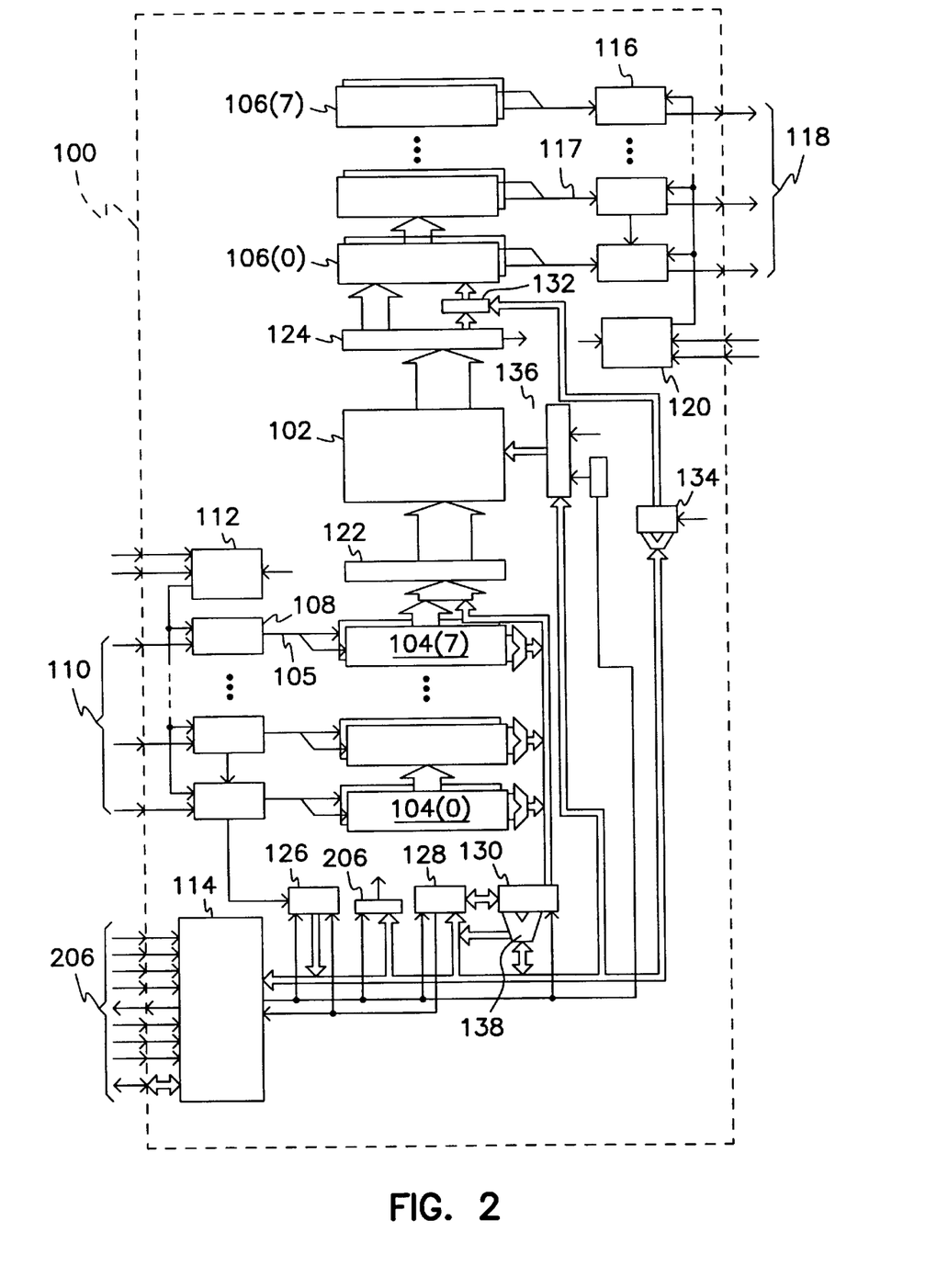
FIG. 2 is a detailed block diagram of the multi-port memory of FIG. 1.

A more detailed diagram of the multi-port memory 100 is shown in FIG. 2. The memory has a DRAM 102, input SAMs 104(0)–(7) and output SAMs 106(0)–(7) as described above. Each input port has a corresponding buffer circuit 108. The buffer circuits 108 are used to perform several functions including latch and buffer input data, queue nibble counter, and pointer decoder and control. Four-bit input data communication bus lines 110 provide ATM cell input to the buffer circuits 108. An input frame and clock circuit 112 connected to the buffer circuits both denotes the beginning of an input cell and synchronizes the input data.

Each output SAM 106 has a corresponding buffer circuit 116. The buffer circuit 116 is used to perform several functions including latch and buffer output data, queue nibble counter, and pointer decoder and control. Four-bit output communication bus lines 118 provide ATM cell output from buffer circuits 116. An output frame and clock circuit 120 connected to the output buffer circuits denote the beginning of an output cell and synchronizes the output data.

Byte parity generator 122 provides a parity code for each ATM cell transferred to the DRAM from an input SAM 104, and byte parity check 124 checks the parity of an ATM cell transferred from the DRAM to an output SAM 106. The byte parity generator 122 and byte parity check 124 are described below.

Control interface and command decode 114 interfaces the multi-port memory 100 with an external controller (not shown) and decodes commands provided on interface lines 206 therefrom. Error/status circuit 126 monitors the status of the input SAM's 104 to determine if a transfer to the DRAM is needed and tracks the output from the byte parity check 124 to determine if an error occurred in an ATM transfer. Cyclical redundancy check (CRC) logic 128 and edit buffer control 130 together provide a means of modifying the ATM cell prior to transferring it from an input SAM port 104 to the DRAM, as described below. An output editor 132 and output edit buffer 134 allow for the modification of the ATM cell prior to outputting through the output SAMs 106. Memory control circuit 136 provides the circuitry needed to address the DRAM as known by one skilled in the art.

ATM DATA FLOW

Referring to FIG. 2, in general, ATM cells flow through the buffer circuits 108 into the input serial access memory (ISAM) 104 where editing can be done by an external control function provided through the control interface. The external control function instructs the chip when to store ISAM cells in the DRAM 102 and when to load the output serial access memory ports (OSAM) 106 from the memory 102. The OSAMs deliver the ATM cells to output buffers 116 for dispatch. The following paragraphs describe the data flow in more detail.

ATM cells enter the chip through communication line inputs 110 to the input buffers 108. The 4-bit parallel stream is loaded into an ISAM 104 by the clock associated with the buffers over 4-bit data bus 105. The input frame and clock circuit 112, marking the first data nibble of the ATM cell, is used to start the ISAM load. Once a complete cell has been loaded into an ISAM, the same error/status circuit 126 sets a "ISAM full" status bit. As noted above, the ISAMs are two ATM cells long, so the next ATM cell can continue to stream into the ISAM. An asynchronous, external control function polls the ISAM status through the control interface and command decode 114. Once a ISAM full status is detected by the external controller through the control interface and command decode 114, the first 72 bits of the ISAM are copied to the input edit buffer 130 and the first or second word of the ISAM can be output to the external controller using mux 138. The external controller evaluates and optionally modifies the word and then initiates a write to the DRAM moving the content of the input edit buffer (bits 0–71) and the remaining content of the ISAM (bits 72–447) over a write transfer bus to the DRAM row specified by an address presented through the memory logic control 136. The ISAM full status is cleared when the ISAM is transferred. The first and/or second word of the input edit buffer 130 can be returned by the external controller to modify the content of the ISAM. Further discussion of the input edit buffer operation is presented below. The entire contents of an ISAM can also be directly transferred to the DRAM without copying or evaluating the first 72 bits. In this operation the entire cell is transferred intact.

The external controller polls an output port status through the control interface and command decode 114 for empty OSAMs. Once an empty OSAM 106 is detected, a DRAM read is initiated to move data at a DRAM row specified by an address from the memory control 136 over a read transfer bus to the OSAM. The first and/or second word of the ATM cell can be edited by output edit register 132. Further discussion of the output edit register operation is presented below. Like a write transfer, the transfer to an OSAM clears the empty OSAM status. OSAMs are double buffered, and similar to the ISAMs can continuously stream data out of the output buffers 116. The 4-bit parallel stream is clocked over 4-bit data bus 117 by the clock associated with the output buffers 116 by output frame and clock circuit 120.

CELL EDIT OPERATIONS

The multi-port memory stores ATM cells of 56 bytes in the internal DRAM 102. The standard ATM cell consists of 4 bytes of header, 48 bytes of data, and one byte of header-error-check. The header-error-check is typically a cyclical redundancy check (CRC) code, which is used on communication links and may or may not be presented to the multi-port memory. The remaining space, either 3 or 4 bytes depending on the presence of the CRC, can be used to store specialized routing information for space-division switches, specialized error control information, or any other purpose. These additional bytes are referred to herein as "prepend/postpend" data, and the number of bytes of each is configurable. The prepend/postpend data can be generated, read, written, and stripped through cell editing operations and configuration parameters as detailed below.

The input edit buffer 130, in concert with the CRC circuitry 128, provides a means to modify the ATM cell captured in an ISAM 104 before storing in the DRAM 102. These modifications can be either of the cell header, or of the prepend/postpend data attached to the cell. Updating of the cell header can also include an update of the CRC byte.

The output edit register 132 provides the means to modify the ATM cell contents at the last possible moment prior to outputting the cell. The output edit register provides data to an OR-type logic function, allowing the control interface and command decode 114 to set selected bits in the cell header or prepend/postpend data. If the cell header is updated, the corresponding CRC can also be updated using the output edit register.

All ATM cell editing is performed using the external controller. The external controller can get either the prepend/postpend or header word from an ISAM through edit buffer 130 and mux 138. The first 9 bytes (72 bits) of the selected ISAM are copied into the input edit buffer 130, and either the first or second word out is passed through mux 138 to the command interface and command decode 114, and ultimately to the external controller. A check of the CRC byte can also be performed using CRC logic 128.

After the external controller has examined the header and/or the pre/postpend data, it may update them via a transfer command or a transfer with CRC command. For example, the transfer with CRC command tells the memory to updated the CRC byte. After updating, the controller issues a store ISAM command to copy the ISAM data into the DRAM with any modifications that may have been made in the edit buffer 130 and CRC logic 128.

The output edit register 132 contains 64 data bits that are NOR'ed with the header and prepend/postpend data bytes from the DRAM on its way to an OSAM. This provides a way for the external controller to modify an ATM cell just prior to transmission, to include e.g. up-to-date congestion information, or up-to-date prepended routing information for a next stage switch. The output edit register 132 is controlled by the external controller. Corrections to the CRC byte can also be performed based on an updated header. The CRC byte is updated by an XOR logic operation.

Figure 3:
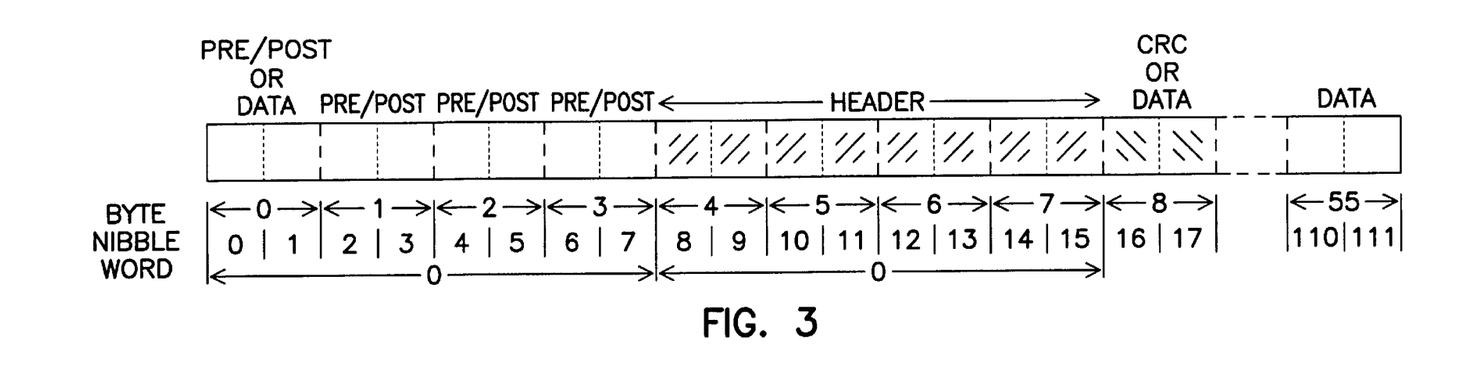
FIG. 3 is a 56 byte ATM cell having a specific byte assignment.
Figure 4:
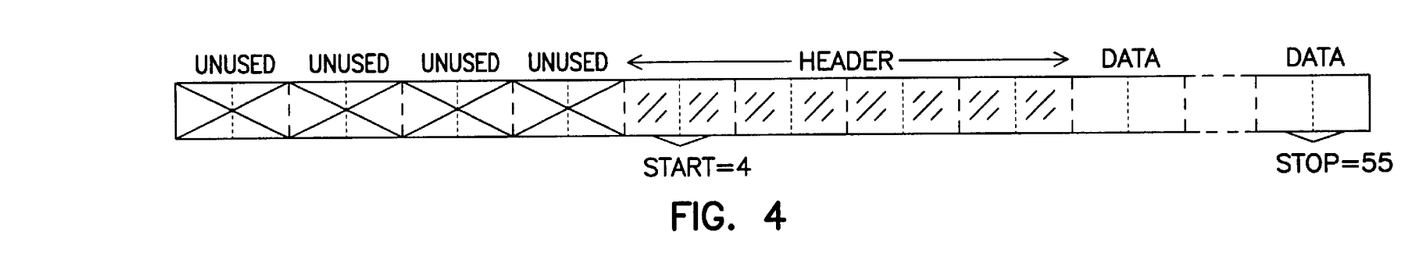
FIG. 4 is a 52 byte ATM cell having a specific byte assignment.
Figure 5:
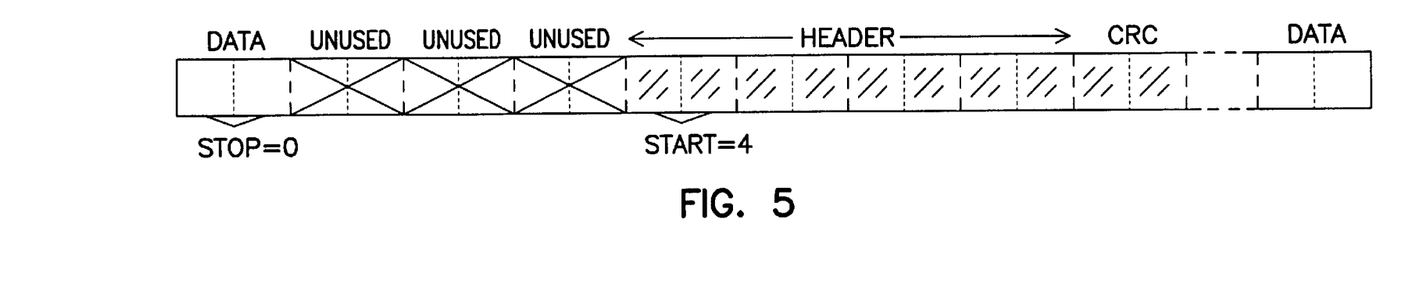
FIG. 5 is a 53 byte ATM cell having a specific byte assignment.

Editing support for various cell lengths is accomplished by defining the ISAM start and stop positions within the ISAM's 56 byte space. The start and stop pointers are loaded by the command interface and command control 114, and are set such that the cell header appears in bytes 4–7 of the ISAM. The CRC byte, if present, is always in byte 8 of the ISAM. FIG. 3 shows the ISAM space with the ATM cell header properly aligned. For the cases without any pre/postpend data, FIG. 4 show the ISAM start pointer set to 4 and the ISAM stop pointer set to 55 if no CRC is present (making a 52 byte cell). Similarly, FIG. 5 shows the start pointer set to 0 if CRC is present (making a 53 byte cell).

There are different configurations for the ISAMs, each giving various amounts of prepended and postpended data. The OSAM start and stop address are separately configurable from the ISAM ones. Thus, outgoing cells can have more bytes or fewer bytes than incoming cells. This feature provides the capability for adding or deleting prepended and postpended data bytes.

DRAM MEMORY ARRAY

Figure 6:
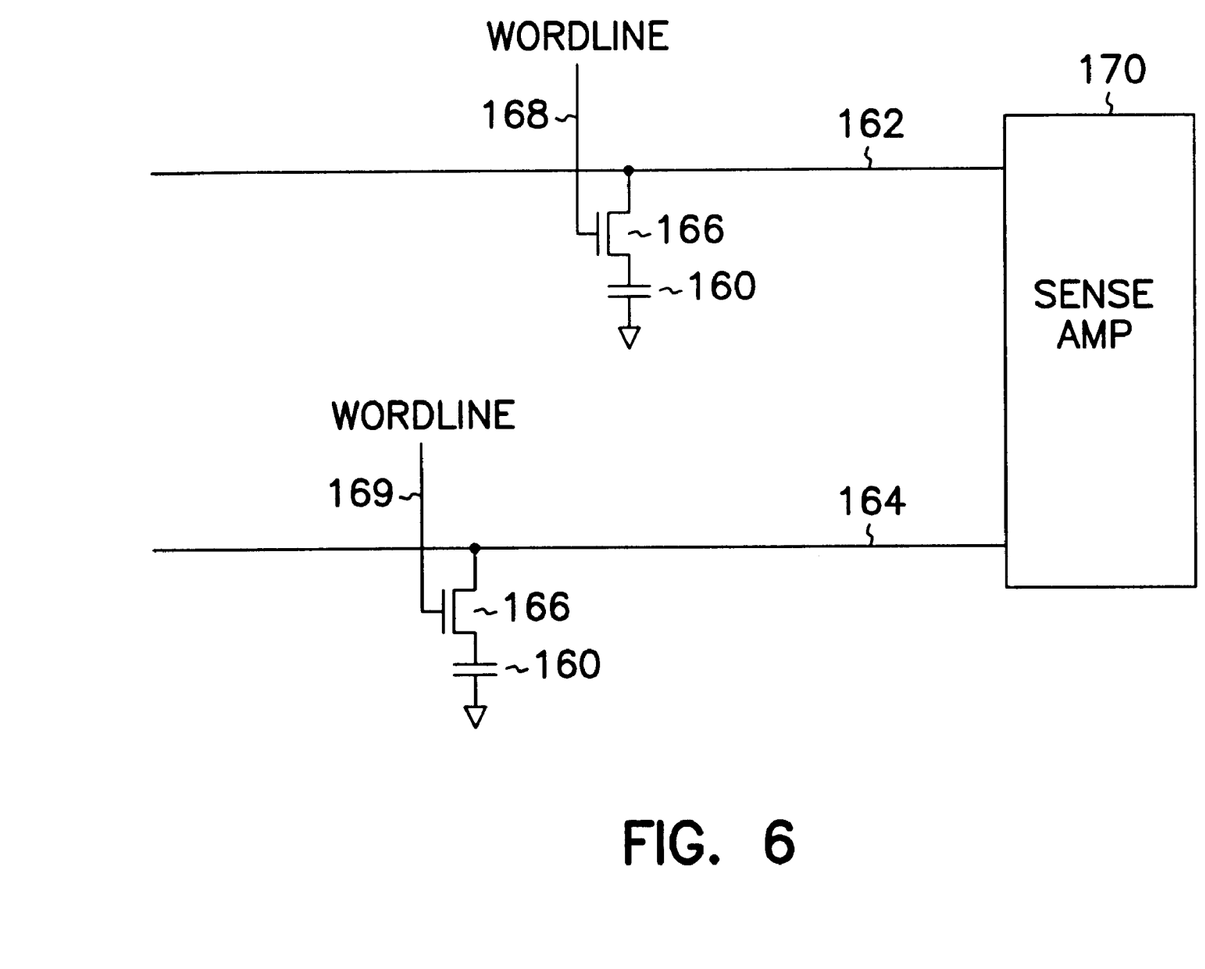
FIG. 6 is a schematic diagram of memory cells.

DRAM 102 includes an array of memory cells arranged in addressable rows and columns. FIG. 6 illustrates one-transistor one-capacitor (1TIC) dynamic memory cell capacitors 160 coupled to a pair of complementary digit lines 162 and 164 via access transistors 166. Data is stored in the memory cell capacitors, or retrieved from the memory cell capacitors, by selectively activating an access transistor using word lines 168 or 169. The memory cell is thereby electrically coupled to one of the complementary digit lines. The complementary digit lines are coupled to sense amplifier circuitry 170, as known to those skilled in the art.

In a conventional DRAM, the memory array is divided into multiple sections which have address boundaries separating each section. Each section has a column select circuit which connects one of the memory columns to an input/output data communication line. The multiple sections are each connected to different I/O lines. A complete row of memory, therefore, is divided among the different sections. Redundant columns of memory cells are provided in each of the multiple sections. The redundant columns can be substituted for defective columns which occur in the same section of memory by using the column decode circuitry. Because the sections are divided, redundant columns cannot be assigned to another section. Thus, the memory array is not repairable if a given section has more defective columns than redundant columns.

Figure 7:
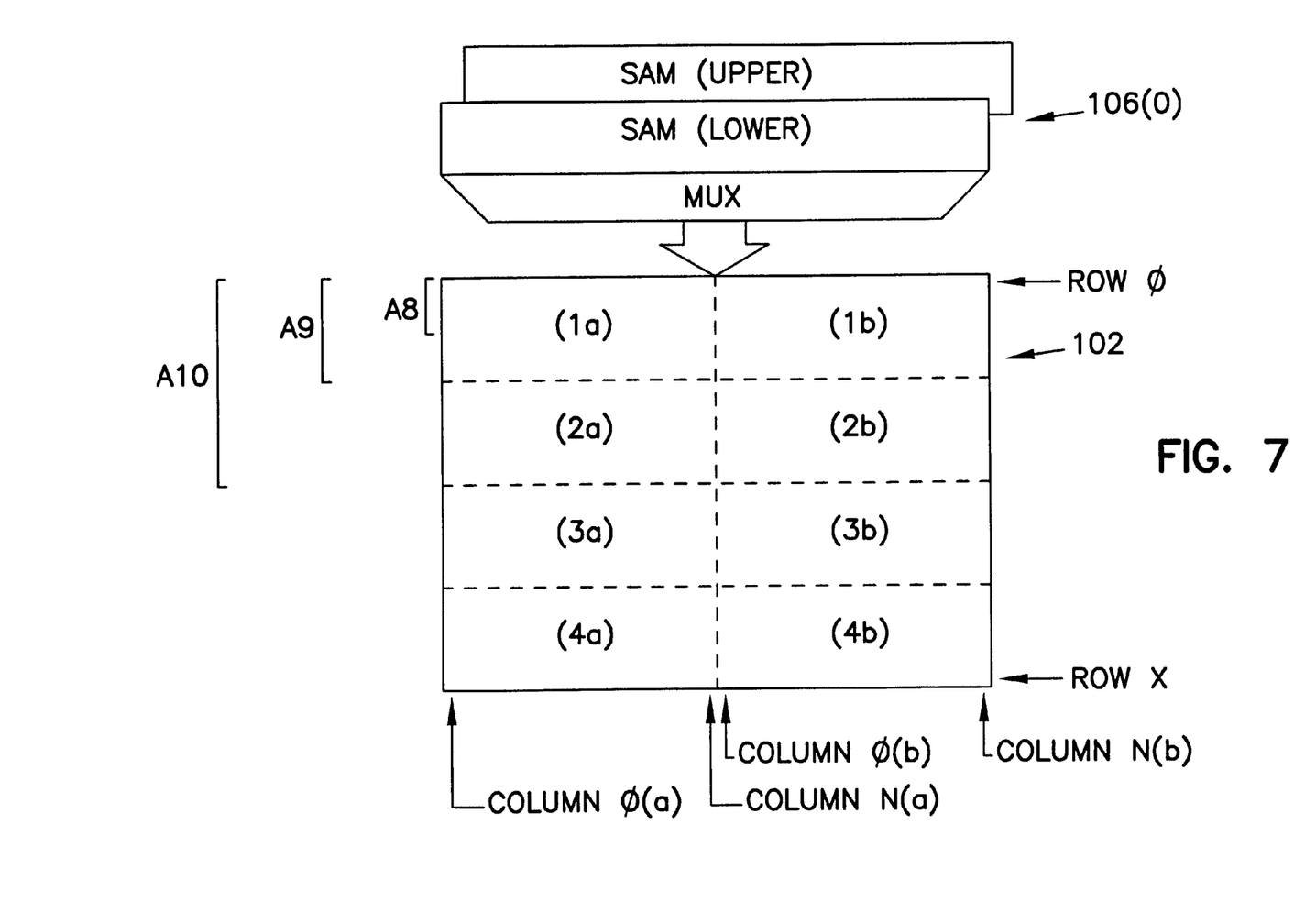
FIG. 7 is a diagram of a memory array.

The DRAM array of the present invention transfers data into any row (0–X) of the memory array, see FIG. 7. In a preferred embodiment, there are 2048 rows of memory cells. The data, therefore, fills up columns 0–N in one data cycle. The preferred array is divided into two equal sections containing columns 0(a)–N(a) or 0(b)–N(b). These sections are illustrated in FIG. 7 as being two halves of the array. Each section, therefore, has 1024 columns. In the preferred embodiment, the columns of the two sections are interleaved. An address line is used to select the half of the memory array which is to be accessed. For example, address line A7 is used to access one half of the array of the preferred memory device.

Each SAM is 1024 bits wide. That is, each SAM an upper half and a lower half, as described above, which in combination can transfer via a 512 bit wide transfer to either section of the array. A four-to-one multiplex circuit is provided to route either of the SAM halves to 512 columns of the 2048 wide array.

The array is conceptually divided into multiple row address sections (1–4) which can be accessed using a row decoder circuit and address inputs. As illustrated in FIG. 7, the memory array rows are accessed using address lines A1–A10. Address line A10 is used to access either sections 1 and two, or sections 3 and 4. Address line A9 is used to select between section 1 or 2 when those sections have been selected by A10. Likewise, address line A9 is used to select between section 3 or 4 when those sections have been selected by A10. Address line A8 is used to identify half of the section selected by address line A9, and address lines A1–A6 are used to identify a specific row of the array. Address lines A1–A10, therefore, identify one of 1024 rows of memory cells provided in the entire DRAM array 102.

Each one of the eight sections 1(a)–4(b) has redundant rows of memory cells which can be substituted for defective rows of memory cells within the same section. If a section of the array has more defective memory rows than redundant rows, redundant rows can be re-assigned from another section. This is made possible because the transfer bus is capable of being coupled to each of the rows of the memory array.

If a memory array has more defective rows that available redundant rows, a defective section of the array can be disabled. Thus, by reducing the total storage capacity of the ATM switch, the memory array can be made 100% operational.

Figure 8:
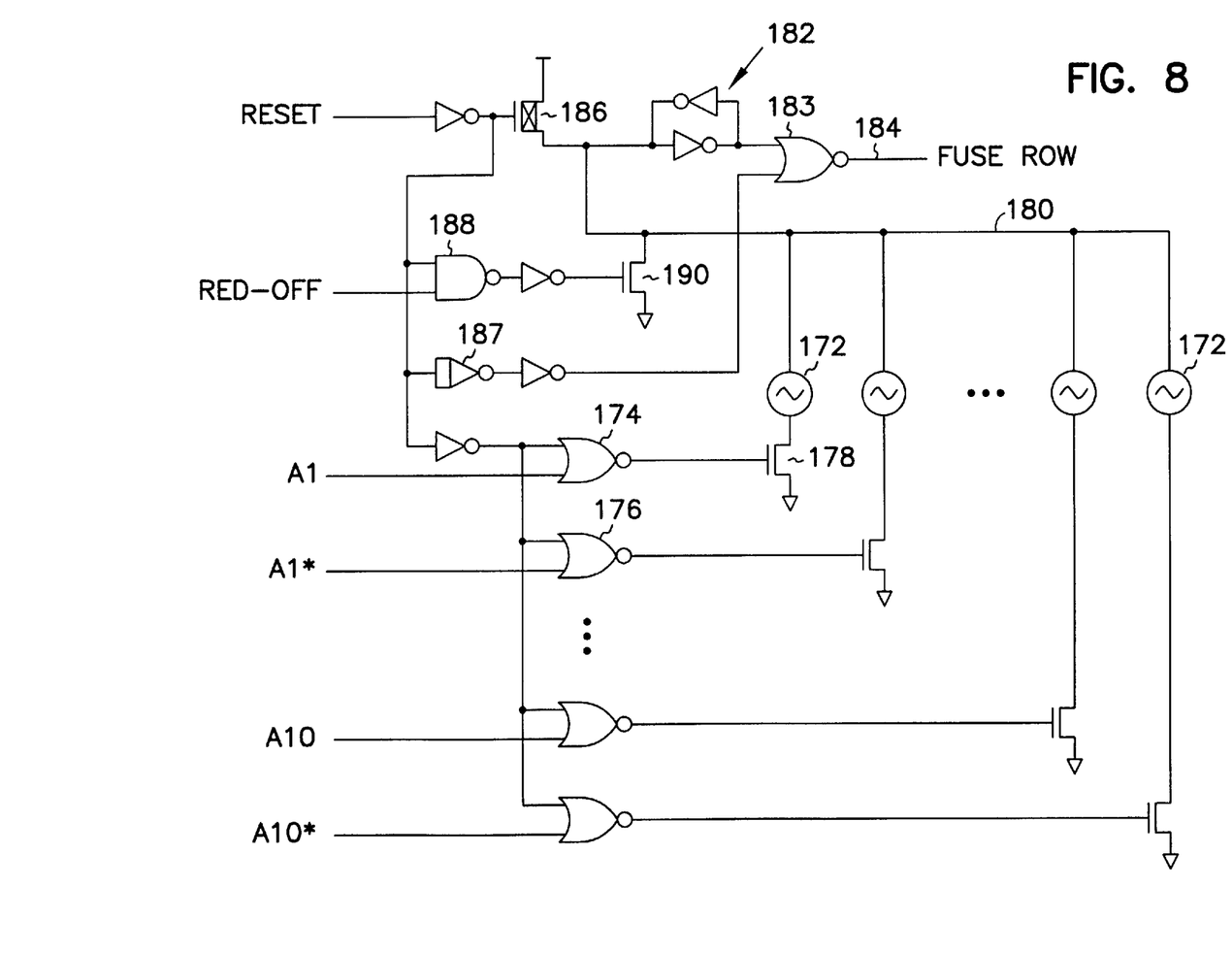
FIG. 8 is a schematic diagram of redundant row enable circuitry.
Figure 9:
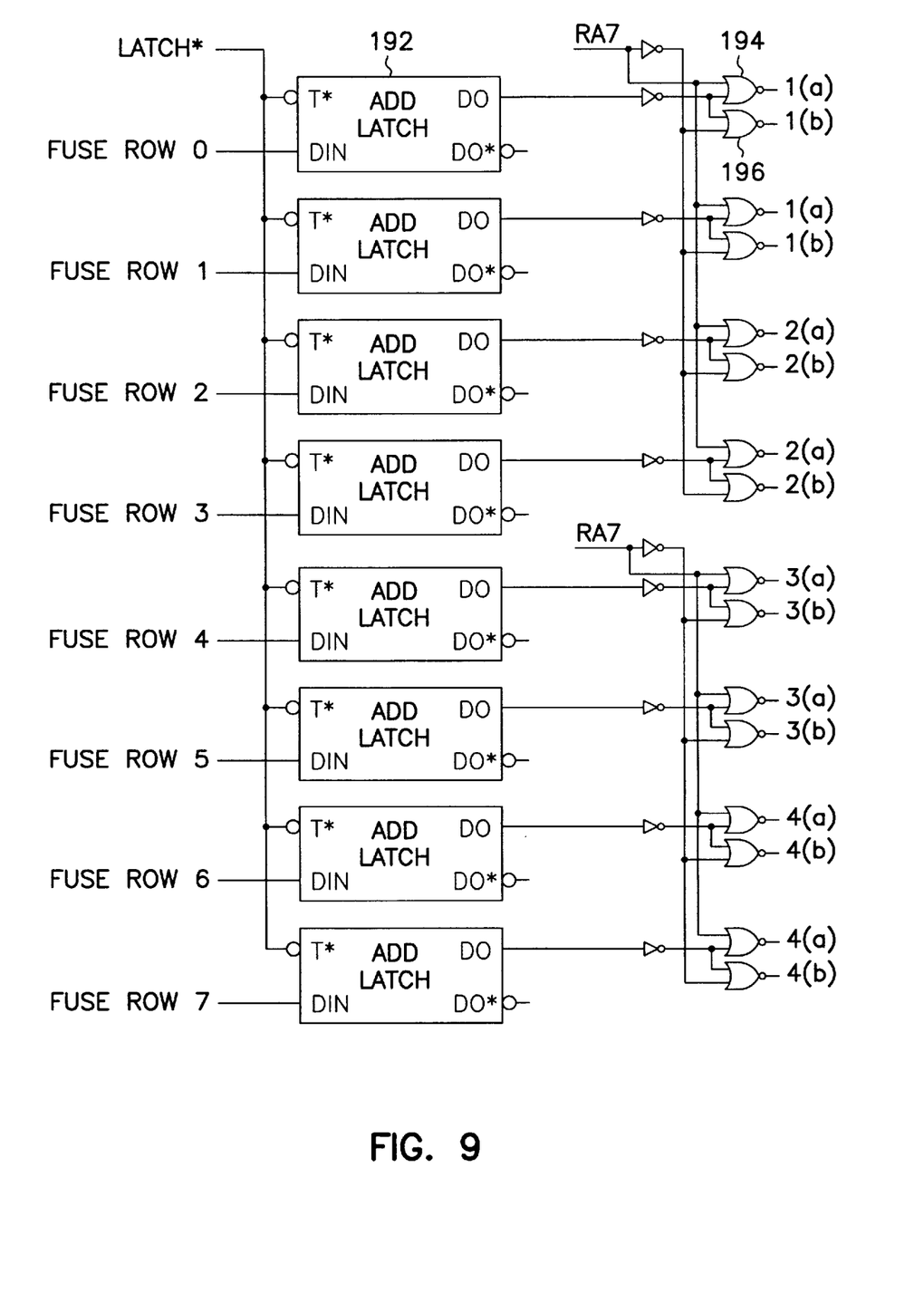
FIG. 9 is a schematic diagram of redundant row enable circuitry.
Figure 10A:
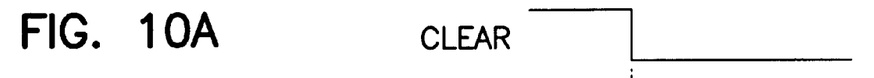
FIGS. 10A–D are timing diagrams of the circuit of FIG. 8.
Figure 10B:
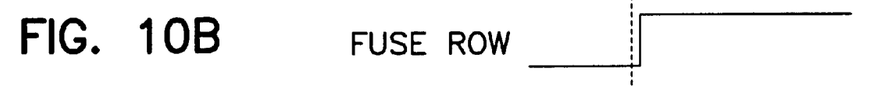
Figure 10C:
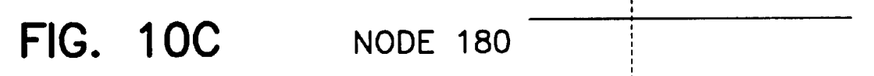
Figure 10D:
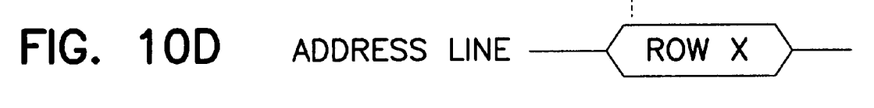
Figure 11A:
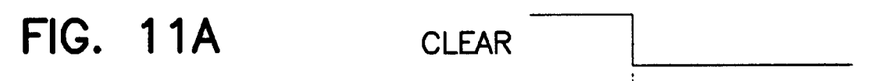
FIGS. 11A–D are alternate timing diagrams of the circuit of FIG. 8.
Figure 11B:
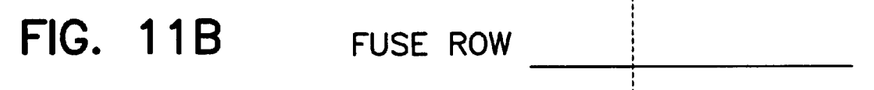
Figure 11C:
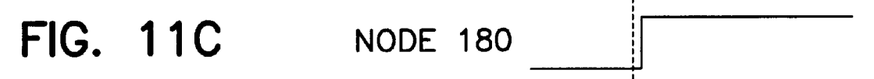
Figure 11D:
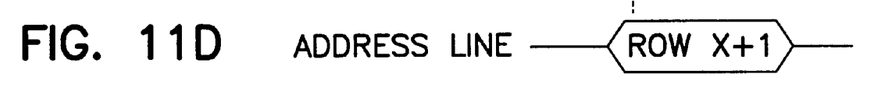

FIGS. 8 and 9 illustrate redundant row enable circuitry which is used to program a redundant row of memory cells. Referring to FIG. 8, a bank of fuses 172 is used to program a redundant row. It will be appreciated that any type of programmable fuse circuit can be used, including anti-fuses. Address lines A1–A6, and A7–A10 and their compliments are provided as inputs to NOR gates 174 and 176. A Clear signal is provided to a second input of NOR gates 174 and 176 to latch the output of the NOR gates while latch 182 is reset. To program a redundant row of memory, fuses 172 are selectively blown such that node 180 is pulled low by transistors 178 if a matching address is not provided on the address lines. Thus, when the Clear signal is high, p-channel transistor 186 pulls node 180 high which is latched by latch circuit 182. When Clear transitions low after the completion of the clear operation, NOR gates 174 and 176 are "enabled" and node 180 is pulled low if signals provided on the address lines do not match the programmed fuses 172. If an address match is established, latch 182 will remain latched to the state set during the clear operation. Thus, latch 182 is preset to indicate a valid redundant row and is reset when a mis-matched row address is received. When an address match is established, the defective primary row of the memory array is disabled and the redundant row is enabled. The Fuse Row signal can be used to trigger a disable circuit (not shown) which prevents the defective row from being coupled to the data bus lines.

FIG. 10 illustrates the operation of the circuit of FIG. 8 when an address match occurs. When the Clear signal is high, node 180 is pulled high through transistor 186. The output of latch 182, therefore, is latched low. The output of NOR gate 183 remains low while Clear is high, thereby holding the Fuse Row signal low. When Clear transitions low, the address lines are rippled through NOR gates 174 and 176. Node 180 remains high if an address match is established. The output of latch 182 remains latched in a low state so that when the Clear signal transitions low the Fuse Row signal transitions to a high state. The falling edge of the Clear signal is delayed by delay circuit 187 so that the latch 182 can change states prior to "enabling" NOR 183.

It will be appreciated that if there is not an address match, node 180 will transition low and Fuse Row will remain low when the Clear signal transitions low. FIG. 11 illustrates the operation of the circuit of FIG. 8 when an address match does not occur. When the Clear signal is high, node 180 is pulled high through transistor 186. The output of latch 182, therefore, is latched low. The output of NOR gate 183 remains low while Clear is high, thereby holding the Fuse Row signal low. When Clear transitions low, the address lines are rippled through NOR gates 174 and 176. Node 180 is pulled low if an address match is not established. The output of latch 182 is latched in a high state so that when the Clear signal transitions low the Fuse Row signal remains latched at in a low state. Further, a RED_OFF signal is provided with NAND gate 188 and transistor 190 to pull node 180 low and turn off a redundant row by pulling node 180 low regardless of the state of the address lines.

FIG. 9 is a schematic diagram of redundant row select circuitry used to select one of the eight redundant rows provided in sections 1–4 of the memory array 102. Latch circuits 192 latch a Fuse Row signal, as described above, in response to a Latch* signal. The output of the latch circuits and address line A7 are coupled to NOR gates 194 and 196. If the Fuse Row signal is high, thereby indicating an address match, either NOR 194 or 196 is activated to select the redundant row located in either memory array half (a) or array half (b), respectively. As stated above, each array section 1(a)–4(b) has two redundant rows of memory cells.

Figure 12:
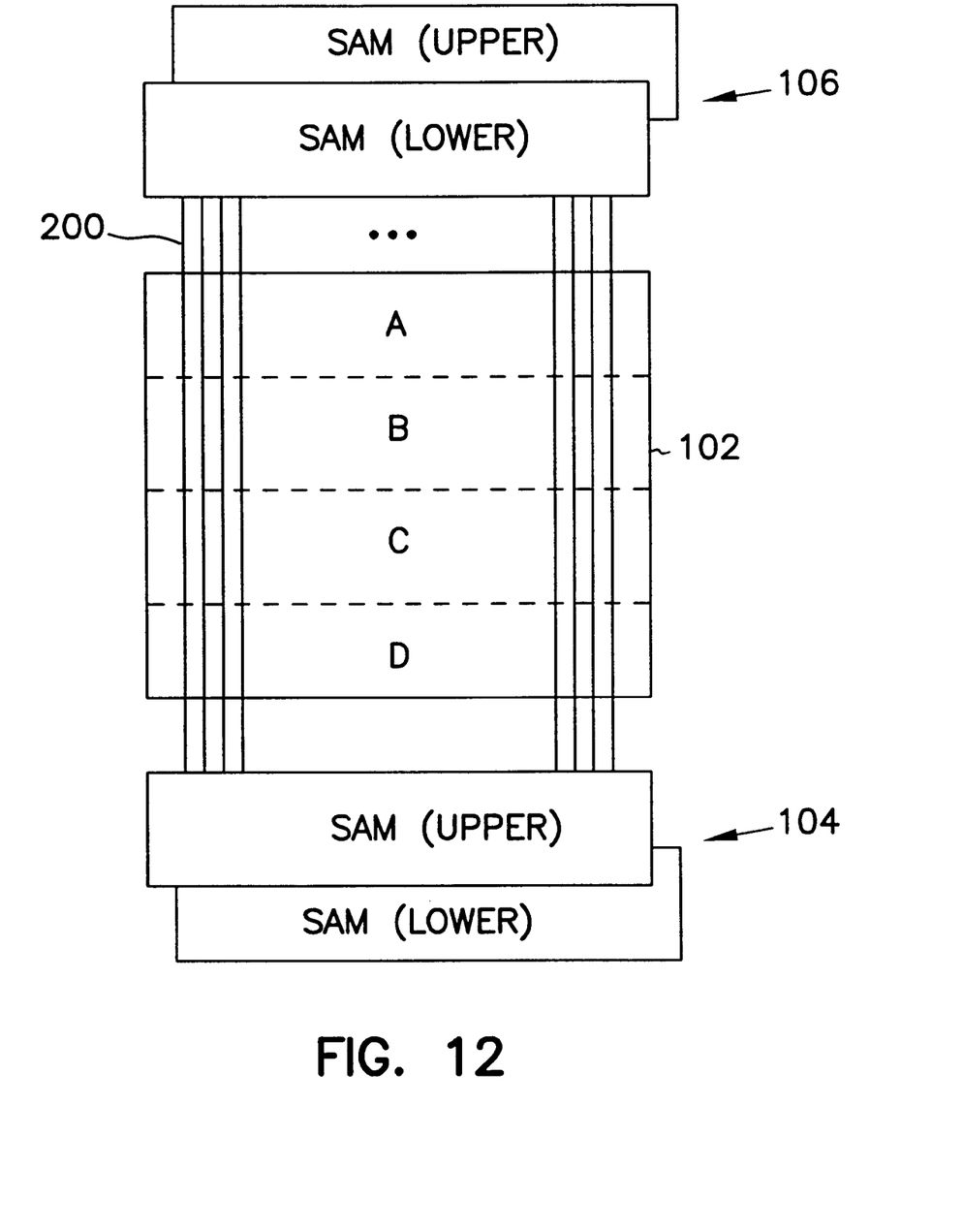
FIG. 12 shows a memory array and transfer data buses.

FIG. 12 illustrates the memory array 102 and data transfer buses 200 which couple a selected memory array row to the SAM's. As described above, each of the input and output SAMs are divided into upper and lower halves. Each half is 512 bits wide and can communicate with one-quarter of the available columns of the memory array. The 512 bit wide transfer bus coupled the SAMs and the DRAM array. A four-to-one multiplex circuit is provided to select which quarter of the DRAM columns is coupled to the data transfer lines. Thus, during a write operation, data from one of the input SAM's 104 is coupled to a transfer bus which spans the memory array. It is preferred that the transfer bus be fabricated as a second metal layer, but can be fabricated using any conductor available in the integrated circuit fabrication. The transfer bus is connected to the digit lines through addressable coupling devices, preferably through the sense amplifier circuitry. In the memory device described above having 1024 addressable columns, 1024 data buses 200 are provided.

Conclusion

An ATM chip has been described which transfers data from an input serial access memory (ISAM) to a dynamic memory array for storage. The data is then retrieved from the array and transferred to an output serial access memory (OSAM). Data is transferred between the array and the serial memories via a transfer bus which spans the array and individual rows of the memory array are coupled to the transfer bus. The memory array is divided into separate addressable section with each section having redundant rows of memory cells. The redundant rows of memory cells can be substituted for defective memory rows located in the same array section. The redundant rows can also be substituted for defective array rows located in different array sections.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A method of transferring data between a static memory and a dynamic memory array arranged in rows and columns, the method comprising the steps of:

coupling the static memory to transfer buses which physically traverses all of the rows of the dynamic memory array;

selectively coupling the transfer buses to columns of the dynamic memory array; and selecting a row of the dynamic memory array, wherein the step of selecting an row comprises the step of selecting a redundant row of the dynamic memory array.

2. The method of claim 1 wherein the step of selectively coupling the transfer buses comprises the step of multiplexing the transfer buses to the columns of the dynamic memory array.

3. A method of transferring data between a static memory array and a dynamic memory array arranged in rows and columns, wherein the rows of the dynamic memory array include a plurality of primary rows and a plurality of redundant rows, and a plurality of transfer buses which physically traverses all rows of the dynamic memory array, the method comprising:

coupling the static memory array to the transfer buses;

selectively coupling the transfer buses to columns of the dynamic memory array; and selecting a row of the dynamic memory array, wherein the step of selecting a row comprises the step of selecting a redundant row of the dynamic memory array.

4. The method of claim 3, wherein selectively coupling the transfer buses comprises multiplexing the transfer buses to the columns of the dynamic memory array.

5. The method of claim 3, wherein selectively coupling the transfer buses to columns of the dynamic memory array includes selecting a sense amplifier.

\* \* \* \* \*